United States Patent
Carr

(10) Patent No.: US 6,966,042 B2
(45) Date of Patent: Nov. 15, 2005

(54) SYSTEM FOR DETECTING AND REPORTING DEFECTS IN A CHIP

(75) Inventor: Jeffrey D. Carr, Vestal, NY (US)

(73) Assignee: International Business Machine Corporation, Armonk, NY (US)

( * ) Notice: Subject to any disclaimer, the term of this patent is extended or adjusted under 35 U.S.C. 154(b) by 301 days.

(21) Appl. No.: 10/387,796

(22) Filed: Mar. 13, 2003

(65) Prior Publication Data

US 2004/0181762 A1 Sep. 16, 2004

(51) Int. Cl.$^7$ .............................................. G06F 17/50
(52) U.S. Cl. ...................... 716/4; 716/1; 716/5; 716/6
(58) Field of Search ...................... 716/1, 4–6; 714/25, 714/30, 48, 699, 798, 799; 370/242–253

(56) References Cited

U.S. PATENT DOCUMENTS

| | | | |
|---|---|---|---|
| 4,773,064 A | * | 9/1988 | Nirschl ........................ 370/244 |
| 5,226,153 A | | 7/1993 | DeAngelis et al. |
| 5,471,631 A | | 11/1995 | Beardsley et al. |
| 5,734,876 A | | 3/1998 | Kowert |
| 5,790,431 A | | 8/1998 | Ahrens, Jr. et al. |
| 6,012,096 A | | 1/2000 | Link et al. |
| 6,363,477 B1 | | 3/2002 | Fletcher et al. |
| 6,370,493 B1 | | 4/2002 | Knapp et al. |
| 6,397,315 B1 | | 5/2002 | Rahman et al. |
| 6,425,109 B1 | * | 7/2002 | Choukalos et al. ............ 716/1 |
| 6,460,067 B1 | | 10/2002 | Chaudhry et al. |

FOREIGN PATENT DOCUMENTS

JP            2000187585 A      7/2000

OTHER PUBLICATIONS

Rincon et al., "Core–Asic Methodology: The Pursuit of System–On–A–Chip," IEEE, 1997, pp. 46–54.*
Donnelly et al., "Reconfigurable Devices for Erro–Detection/Correction Applications," IEEE, 1999, pp. 1–4.*

* cited by examiner

*Primary Examiner*—Vuthe Siek
(74) *Attorney, Agent, or Firm*—William H. Steinberg; Hoffman, Warnick & D'Alessandro LLC

(57) ABSTRACT

Under the present invention, each of a set of functional chiplets in a chip includes an error condition staging system and a trap condition control system. The error condition staging system includes error condition combinational logic that detects a set of error conditions, and a set of error condition registers that store data related to the set of error conditions. The data in the set of error condition registers is communicated to an output multiplexor, which is controlled by a trap signal outputted from the trap condition control system. An error condition signal containing the data is outputted from the output multiplexor and is received by an operational chiplet. The operational chiplet also receives clock signals from a clock controller pertaining to each functional chiplet. Based on the error condition signals and the clock signals, the operational chiplet reports any defects in the functional chiplets to a host processor.

20 Claims, 4 Drawing Sheets

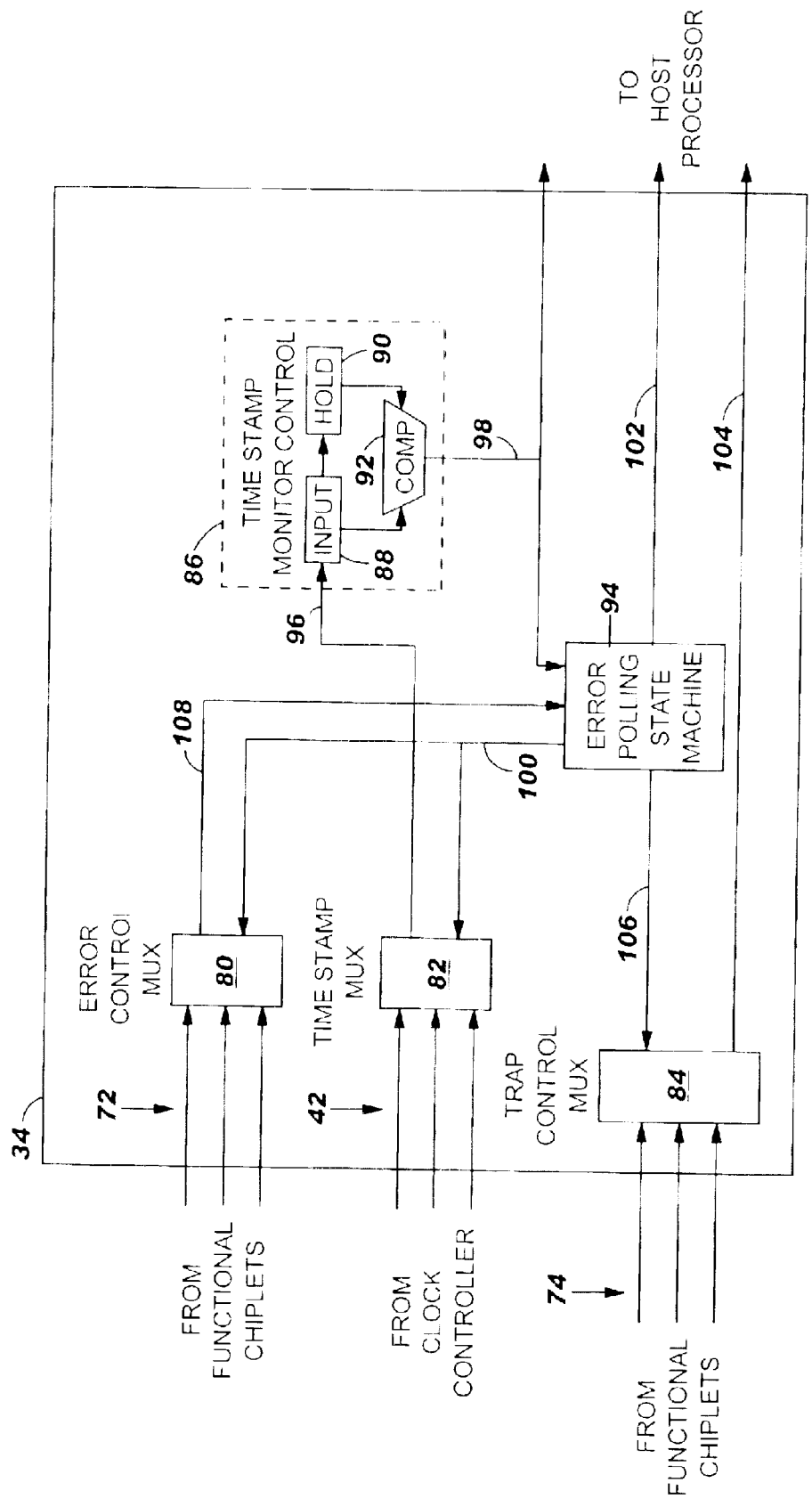

SYSTEM FOR DETECTING AND REPORTING DEFECTS IN A CHIP

BACKGROUND OF THE INVENTION

1. Field of the Invention

The present invention generally relates to a system for detecting and reporting defects in a chip. Specifically, the present invention provides a chip having a set of functional chiplets and an operational chiplet that are designed to detect and report errors and/or hang conditions to a host processor.

2. Background Art

In current computer chip designs, defects (e.g., error or hang conditions) found during validation of the chip design are extremely difficult to diagnose and fix. In cases where a defect is found, it can typically be debugged only by analyzing signals from within the chip itself after the signals have been gated to the input/outputs (I/Os) of the chip or through a host processor. However, since only a limited number of I/Os are used for the debug process, a limited number of signals are available to the designers to diagnose the defect. The signals that are present are analyzed by connecting either a scope or logic analyzer to the chip and rerunning the failing operations repeatedly to determine (if possible) the cause of the defect. In cases where the chip hangs, it is significantly difficult to analyze the problem since the internal logic of the chip often becomes unresponsive and therefore limits the ability to check internal register values.

These problems are compounded by the fact that any one chip could have been designed by several designers. For example, a chip can include one or more "functional" chiplets that each performs several functions. To this extent, each functional chiplet could have been designed by multiple designers. To debug a defect, each designer must look at the signals generated by his design, and determine whether it is causing the defect. For example, assume there were twelve signals generated for debugging a defect. Further assume that signals 1–4 pertain to designer "A's" design, signals 5–8 pertain to designer "B's" design, while signals 9–12 pertain to designer "C's" design. Typically, each designer must individually analyze their own set of signals to determine whether his design is causing the defect. That is, designer "A" cannot usually analyze designer "B's" signals or vice versa. Also, designers cannot usually analyze their respective signals concurrently. Thus, debugging of a defect could not only be hampered by the limited amount of information available, but also by the availability of the designers.

In view of the foregoing, there exists a need for a system for detecting and reporting defects in a chip. Specifically, a need exists for each functional chiplet within a chip to include a design that allows defects to be efficiently detected. A further need exists for the chip to include an operational chiplet that communicates with the functional chiplets. Still yet, a need exists for the operational chiplet to analyze signals, and report any defects in the functional chiplets to a host processor.

SUMMARY OF THE INVENTION

In general, the present invention provides a system for detecting and reporting defects in a chip. Specifically, under the present invention, each functional chiplet in the chip includes an error condition staging system and a trap condition control system. The error condition staging system includes error condition combinational logic that detects a set of error conditions, and a set of error condition registers that store data related to the set of error conditions. The data in the set of error condition registers is communicated to an output multiplexor, which is controlled by a trap signal outputted from the trap condition control system. An error condition signal containing the data is outputted from the output multiplexor, and is received by an operational chiplet on the chip. The operational chiplet also receives clock signals from a clock controller that pertain to each functional chiplet. Based on the error condition signals and the clock signals, the operational chiplet reports any defects (e.g., error and/or hang conditions) in the functional chiplets to the host processor.

According to a first aspect of the present invention, a chiplet design for detecting defects in a functional chiplet is provided. The chiplet design comprises: (1) an error condition staging system having error condition combinational logic for detecting a set of error conditions, and a set of error condition registers for storing data related to the set of error conditions, wherein the data is outputted from the set of error condition registers to an output multiplexor; and (2) a trap condition control system for outputting a trap signal that controls the output multiplexor.

According to a second aspect of the present invention, an operational chiplet for reporting defects in a functional chiplet to a host processor is provided. The operational chiplet comprises: (1) an error condition multiplexor for receiving an error condition signal from the functional chiplet; (2) a time stamp multiplexor for receiving clock signals pertaining the functional chiplet; (3) a time stamp monitor control for processing the clock signals to determine whether the functional chiplet is hanging; and (4) a state machine for reporting the defects of the chiplet to the host processor based on signals received from the error condition multiplexor and the time stamp monitor control.

According to a third aspect of the present invention, a chip having a system for detecting and reporting defects to a host processor is provided. The chip comprises: (1) a set of functional chiplets that each include: (a) error condition staging system having error condition combinational logic for detecting a set of error conditions, and a set of error condition registers for storing data related to the set of error conditions, wherein the data is outputted from the set of error condition registers to an output multiplexor; (b) a trap condition control system for outputting a trap signal that controls the output multiplexor; and (2) an operational chiplet for receiving error condition signals from the set of functional chiplets and clock signals from a clock controller, wherein the operational chiplet processes the error condition signals and the clock signals and reports the defects to the host processor.

Therefore, the present invention provides a design for detecting and reporting defects in a functional chiplet.

BRIEF DESCRIPTION OF THE DRAWINGS

These and other features of this invention will be more readily understood from the following detailed description of the various aspects of the invention taken in conjunction with the accompanying drawings in which:

FIG. 4 depicts a more detailed diagram of the operational chiplet of FIG. 2, according to the present invention.

Figure 1:
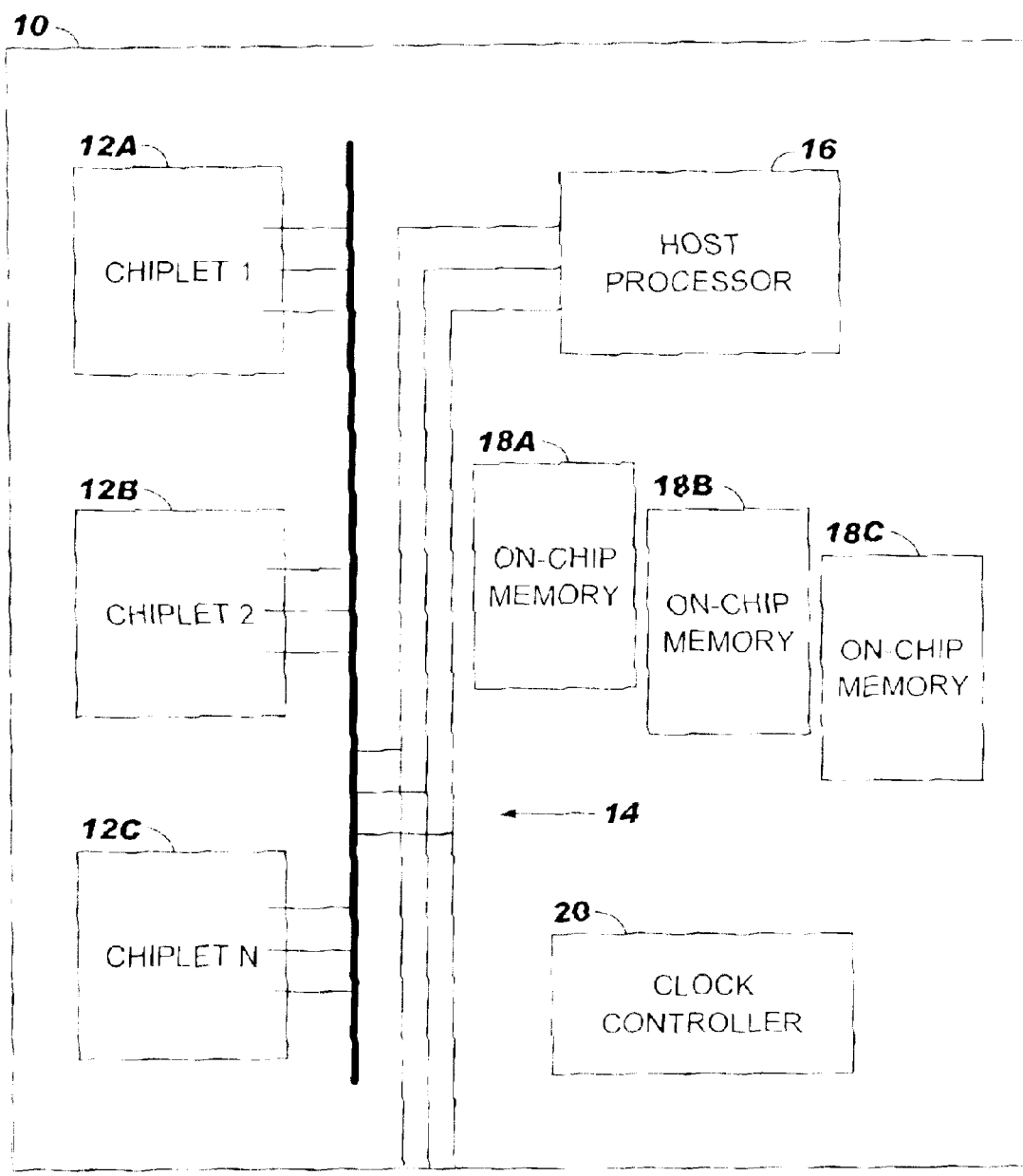
FIG. 1 depicts a debug bus design for reporting chiplet defects to a host processor.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, the present invention provides a system for detecting and reporting defects in a chip. Specifically, under the present invention, each functional chiplet in the chip includes an error condition staging system and a trap condition control system. The error condition staging system includes error condition combinational logic that detects a set of error conditions, and a set of error condition registers that store data related to the set of error conditions. The data in the set of error condition registers is communicated to an output multiplexor, which is controlled by a trap signal outputted from the trap condition control system. An error condition signal containing the data is outputted from the output multiplexor, and is received by an operational chiplet on the chip. The operational chiplet also receives clock signals from a clock controller that pertain to each functional chiplet. Based on the error condition signals and the clock signals, the operational chiplet reports any defects (e.g., error and/or hang conditions) in the functional chiplets to the host processor.

Referring now to FIG. 1, a chip 10 having a debug bus 14 is shown. As depicted, chip 10 includes functional chiplets 12A–C, host processor 16, on-chip memory modules 18A–C and clock controller 20. It should be understood that the depiction of chip 10 is illustrative only and that many other variations exist. For example, chip 10 could include additional components that are not shown. Moreover, chip 10 could have a different quantity of functional chiplets 12A–C, on-chip memory modules 18A–C, etc. In any event, functional chiplets 12A–C are typically designed to each perform one or more functions. Unfortunately, functional chiplets 12A–C occasionally have defects such as error conditions and/or hang conditions that are discovered during validation. Prior to the present invention, one method to detect and debug such defects utilized debug bus 14. For example, if chip 10 was discovered to be defective, signals would be transmitted from functional chiplets 12A–C to host processor 16 over debug bus 14. Each designer would then look at the signals corresponding to his design to attempt to determine whether his design was causing the defect. Unfortunately, as indicated above, not only was limited information available (i.e., since only a few signals were transmitted from functional chiplets 12A–C), but numerous designers could have been involved in the design of functional chiplets 12A–C. Specifically, each functional chiplet 12A–C could have numerous "islands" of function that were each designed by a different designer. Debugging of defects could thus have required coordination of many designers.

Figure 2:
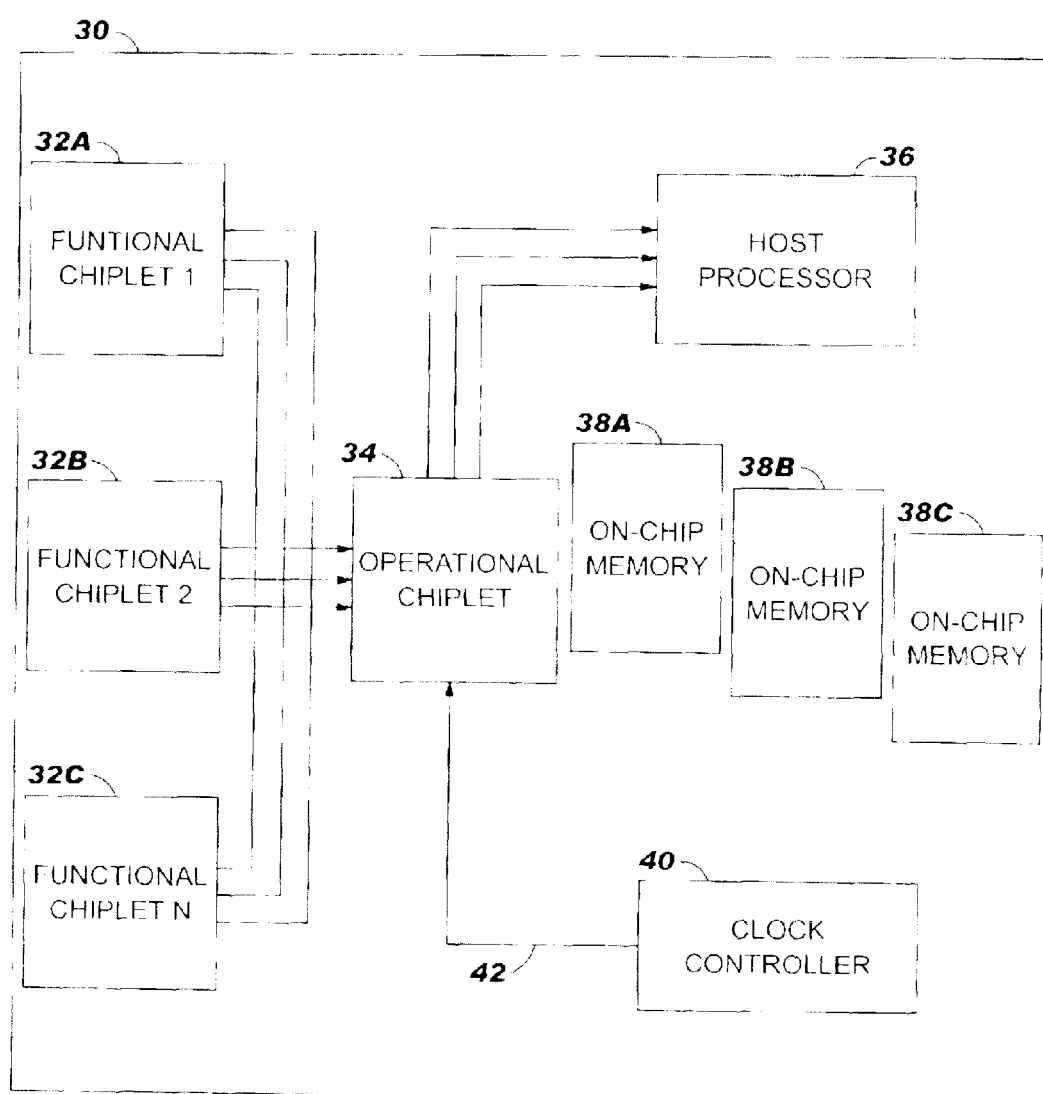
FIG. 2 depicts a design for detecting and reporting functional chiplet defects to a host processor, according to the present invention.

Referring now to FIG. 2, a chip 30 according to the present invention is shown. As depicted, chip 30 includes functional chiplets 32A–C, operational chiplet 34, host processor 36, on-chip memory modules 38A–C, and clock controller 40. Under the present invention, each functional chiplet 32A–C is designed/programmed to detect error conditions, and report to operational chiplet 34. In addition, operational chiplet 34 will also receive clock signals 42 from clock controller 40 (e.g., based on continuous polling or the like), which are used to determine whether any of functional chiplets 32A–C are hanging. Operational chiplet 34 will then report any found defects (error or hang conditions) to host processor 36. Similar to chip 10 of FIG. 1, it should be understood that the depiction of chip 30 is illustrative only and that many other variations exist. For example, chip 30 could include additional components that are not shown. Moreover, chip 30 could have a different quantity of functional chiplets 32A–C, on-chip memory modules 38A–C, etc.

Figure 3:
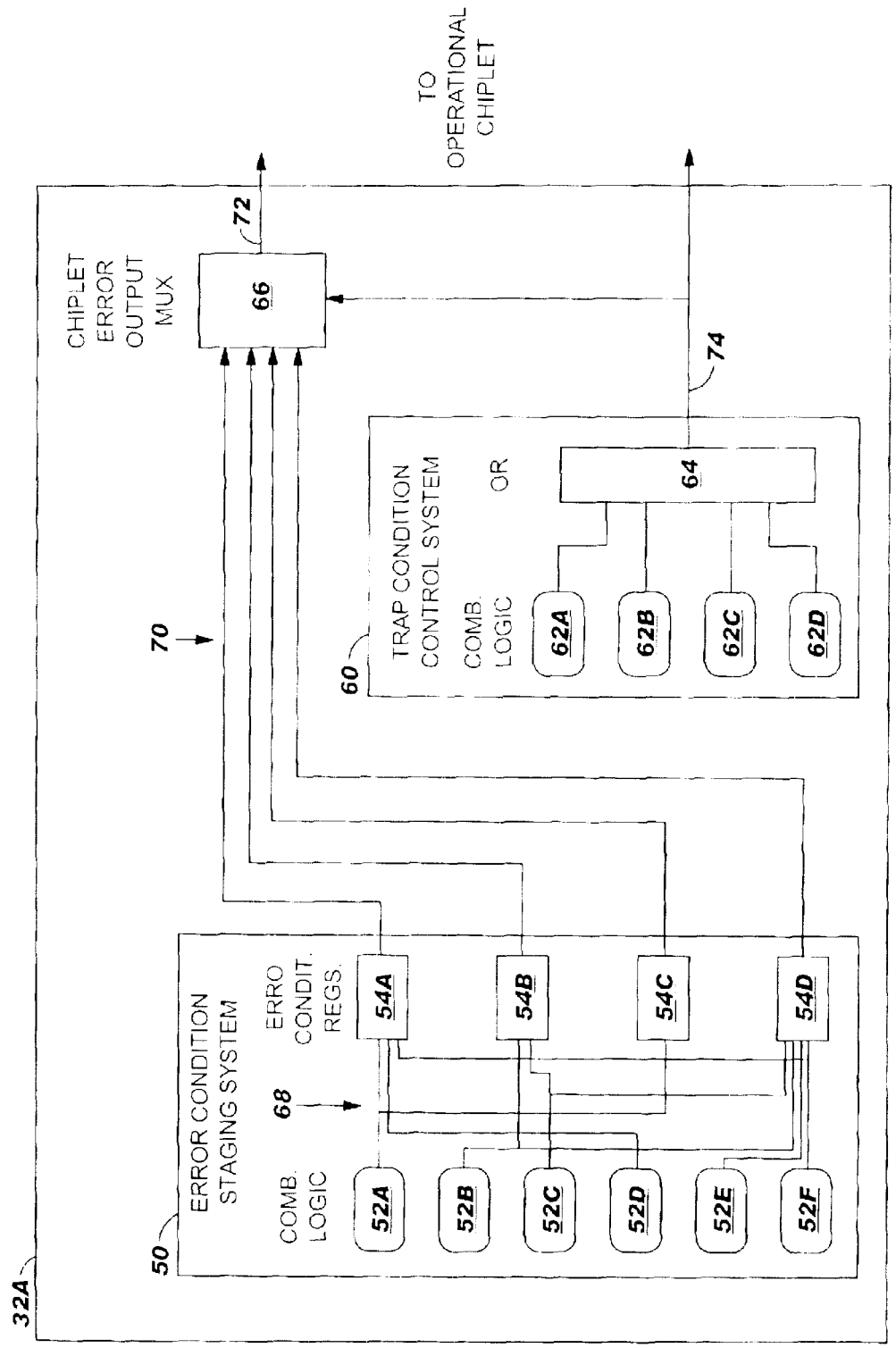
FIG. 3 depicts a more detailed diagram of one of the functional chiplets of FIG. 2, according to the present invention.

Referring now to FIG. 3, a more detailed diagram of functional chiplet 32A is shown. It should be understood that although not shown, other functional chiplets 12B–C contain similar components and function in a like manner. As depicted, functional chiplet 32A includes error condition staging system 50, trap condition control system 60, and chiplet error output multiplexor (hereinafter "output multiplexor") 66. Trap condition control system 60 includes trap condition combinational logic 62A–D and OR gate 64. In general, trap condition combinational logic 62A–C defines a set (i.e., one or more) of trap conditions for functional chiplet 32A. For example, one trap condition (e.g., as defined by combinational logic 62A), could state that signals "A–F" must be received by functional chiplet 32A for proper function. Moreover, each block of trap condition combinational logic 62A–D could pertain to a different "island" of function for functional chiplet 32A (although this need not be the case). In any event, each block of trap conditional combination logic 62A–D typically pertains to one or more blocks of error condition combinational logic 52A–F within error condition staging system 50 (e.g., condition combinational logic 52A and 52B could both pertain to trap condition combinational logic 62A). Specifically, error condition combination logic 52A–F detects a set (i.e., one or more) of error conditions that provide a finer level of detail of the set of trap conditions. For example, if trap condition combinational logic 62A dictates that signals "A–F" must be received, error condition combination logic 52A could dictate that signals "A–C" must be received simultaneously, while error condition combination logic 52B could dictate that after signals "A–C" are simultaneously received, signals D–F must be received one after another.

In any event, error condition combinational logic 52A–F monitors the performance of functional chiplet 32A, detects whether any of a set (e.g., one or more) of error conditions is occurring, and writes data related to the set of error conditions to error condition registers 54A–D. For example, if error condition combination logic 52B detects that signals "D–F" are received out of order, a certain bit in one of error condition registers 54A–D could be set to "1" (or some other value). To this extent, each block of error condition combination logic 52A–F communicates with at least one error condition register 54A–D as shown. In any event, each error condition registers 54A–D communicate the "error condition" data written therein to output multiplexor 66 via register signals 70. Output multiplexor 66 then outputs an error control signal 72 to the operational chiplet (as will be further described below). OR gate 64 of trap condition control system 60 receives signals from trap condition combinational logic 62A–D and outputs a trap signal 74 that is used to control output multiplexor 66, and is communicated to the operational chiplet.

It should be appreciated that the quantity of error condition combinational logic blocks, trap condition combination logic blocks, and error condition registers are intended to be illustrative only. A functional chiplet constructed in accordance with the present invention can have any quantity thereof.

Referring now to FIG. 4, operational chiplet 34 is shown in greater detail. In general, operational chiplet 34 receives information pertaining to error conditions of functional chiplets 32A–C, determines whether any of functional chiplets 32A–C are hanging, and reports any such defects to host processor 36. As depicted, operational chiplet 34 includes error control multiplexor 80, time stamp multiplexor 82, trap control multiplexor 84, time stamp monitor control 86, and error polling state machine (hereinafter "state machine") 94. Error control multiplexor 80 receives error control signals 72 from output multiplexor 66 of functional chiplets 32A–C. Time stamp multiplexor 82 receives clock signals 42 from clock controller 40 (FIG. 2). As will be further described below, clock signals 42 are used to determine whether any of functional chiplets 32A–C are hanging. To this extent, clock signals 42 could be received as a result of continuous polling by operational chiplet 34. Trap control multiplexor 84 receives trap signals 74 from trap condition control system 60 of functional chiplets 32A–C. It should be understood that for illustrative purposes, each individual line in signals 72, 42 and 74 corresponds to one signal received from one functional chiplet 32A, 32B, or 32C.

As depicted, error control multiplexor 80 will output an error control multiplexor signal 108 to state machine 94. Typically, the error control multiplexor signal 108 contains "error" data that specifically describes one or more error conditions being exhibited by a functional chiplet 32A–C. For example, if signals D–F were received out of order by functional chiplet 32A, error control multiplexor signal 108 would indicate that error condition. Time stamp multiplexor 82 receives clock signals 42 and outputs a time stamp multiplexor signal 96 to time stamp monitor control 86, which determines whether any of functional chiplets 32A–C are experiencing hang conditions as well as the order of defects. Specifically, as shown, time stamp monitor control 86 includes input block 88, hold block 90 and comparator 92. Based on time stamp multiplexor signal 96, a current time stamp of a functional chiplet (e.g., 32A) is determined and held in input block 88. The current time stamp is then compared by comparator 92 to one or more previous time stamps (i.e., as stored in hold block 90) for the functional chiplet. If the current time stamp matches a previous time stamp, the functional chiplet has reached a hang condition. If no hang is detected, the current time stamp in time stamp multiplexor signal 96 will then be stored in hold block 90 and compared to a future time stamp. In addition to identifying hangs, the time stamps can be used to determine the order in which defects (error or hang conditions) occurred. For example, the time stamps could be used to determine that functional chiplet 32A experienced a defect before functional chiplet 32B.

The results of the comparison operation are outputted via regulator signal 98 to state machine 94 and host processor 36. As shown, state machine 94 generates one or more state machine signals 100 and 106 that are used to control error control multiplexor 80, time stamp multiplexor 82 and trap control multiplexor 84. Based on state machine signal 106, trap control multiplexor 84 could output a trap control multiplexor signal 104 to host processor 36. In addition, based on error control multiplexor signal 108 and regulator signal 98, state machine 94 also generates a host signal 102 that is communicated to host processor 36. The host signal 102 contains the details of any defects detected. For example, host signal 102 could indicate that signals D–F were received out of order by functional chiplet 32A, and that functional chiplet 32B is hanging. Host signal 102 would also indicate the order in which defects occurred. Thus, by providing the improved design of functional chiplets 32A–C, and by utilizing operational chiplet 34 to coordinate the reporting of the results, the present invention allows more information to be received by host processor 36 in a more efficient manner.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

I claim:

1. A chiplet design for detecting defects in a functional chiplet, comprising:

an error condition staging system having error condition combinational logic for detecting a set of error conditions, and a set of error condition registers for storing data related to the set of error conditions, wherein the data is outputted from the set of error condition registers to an output multiplexor; and a trap condition control system for outputting a trap signal that controls the output multiplexor.

2. The chiplet design of claim 1, wherein the trap condition control system includes trap condition combinational logic that defines a set of trap conditions.

3. The chiplet design of claim 1, further comprising an operational chiplet for reporting the defects of the functional chiplet to a host processor.

4. The chiplet design of claim 3, wherein the operational chiplet comprises:

an error condition multiplexor for receiving an error condition signal from the output multiplexor;

a time stamp multiplexor for receiving clock signals pertaining the functional chiplet;

a time stamp monitor control for processing the clock signals to determine whether the functional chiplet is hanging; and a state machine for reporting the defects of the functional chiplet to the host processor based on signals received from the error condition multiplexer and the time stamp monitor control.

5. The chiplet design of claim 4, wherein the operational chiplet further comprises an input multiplexor for receiving the trap signal from the trap condition control system, wherein the input multiplexor is controlled by a state machine signal outputted from the stamp machine.

6. The chiplet design of claim 4, wherein the error condition multiplexor and the time stamp multiplexor are controlled by a state machine signal outputted from the state machine.

7. The chiplet design of claim 4, wherein the time stamp monitor control compares a current time stamp of the functional chiplet to a previous time stamp of the functional chiplet to determine whether the functional chiplet is hanging.

8. An operational chiplet for reporting defects in a functional chiplet to a host processor, comprising:

an error condition multiplexor for receiving an error condition signal from the functional chiplet;

a time stamp multiplexor for receiving clock signals pertaining the functional chiplet;

a time stamp monitor control for processing the clock signals to determine whether the functional chiplet is hanging; and a state machine for reporting the defects of the chiplet to the host processor based on signals received from the error condition multiplexor and the time stamp monitor control.

9. The operational chiplet of claim 8, further comprising an input multiplexor for receiving a trap signal from a trap condition control system of the functional chiplet, wherein the input multiplexor is controlled by a state machine signal outputted from the state machine.

10. The operational chiplet of claim 9, wherein the trap condition control system of the functional chiplet includes trap condition combinational logic that defines a set of trap conditions.

11. The operational chiplet of claim 8, wherein the error condition multiplexor and the time stamp multiplexor are controlled by a state machine signal outputted from the state machine.

12. The operational chiplet of claim 8, wherein the time stamp monitor control compares a current time stamp of the functional chiplet to a previous time stamp of the functional chiplet to determine whether the functional chiplet is hanging.

13. The operational chiplet of claim 8, wherein the functional chiplet includes an error condition staging system that comprises:

error condition combinational logic for defining a set of error conditions; and a set of error condition registers for storing data related to the set of error conditions.

14. The operational chiplet of claim 13, wherein the functional chiplet further comprises an output multiplexor for receiving the data from the set of error condition registers.

15. A chip having a system for detecting and reporting defects to a host processor, comprising:

a set of functional chiplets that each include:

error condition staging system having error condition combinational logic for detecting a set of error conditions, and a set of error condition registers for storing data related to the set of error conditions, wherein the data is outputted from the set of error condition registers to an output multiplexor;

a trap condition control system for outputting a trap signal that controls the output multiplexor; and an operational chiplet for receiving error condition signals from the set of functional chiplets and clock signals from a clock controller, wherein the operational chiplet processes the error condition signals and the clock signals and reports the defects to the host processor.

16. The chip of claim 15, wherein the trap conditional control system includes trap condition combinational logic that defines a set of trap conditions for the functional chiplet.

17. The chip of claim 15, wherein the operational chiplet includes:

an error condition multiplexor for receiving the error condition signals from the set of functional chiplets;

a time stamp multiplexor for receiving the clock signals from a clock controller;

a time stamp monitor control for processing the clock signals to determine whether any of the set of functional chiplets are hanging; and a state machine for reporting the defects to the host processor based on signals received from the error condition multiplexor and the time stamp monitor control.

18. The chip of claim 17, wherein the operational chiplet further comprising an input multiplexor for receiving the trap signal from the trap condition control system, wherein the input multiplexor is controlled by a state machine signal outputted from the state machine.

19. The chip of claim 17, wherein the error condition multiplexor and the time stamp multiplexor are controlled by a state machine signal outputted from the state machine.

20. The chip of claim 17, wherein the time stamp monitor control compares a current time stamp of the set of functional chiplets to a previous time stamp of the set functional chiplets to determine whether any of the functional chiplets are hanging.

* * * * *

UNITED STATES PATENT AND TRADEMARK OFFICE
CERTIFICATE OF CORRECTION

PATENT NO. : 6,966,042 B2
DATED : November 15, 2005
INVENTOR(S) : Jeffrey D. Carr It is certified that error appears in the above-identified patent and that said Letters Patent is hereby corrected as shown below:

Title page,
Item [73], Assignee, "Machine" should read -- Machines --.

Signed and Sealed this

Twenty-fourth Day of January, 2006

JON W. DUDAS
*Director of the United States Patent and Trademark Office*